US008530310B2

(12) United States Patent
Teo et al.

(10) Patent No.: US 8,530,310 B2
(45) Date of Patent: Sep. 10, 2013

(54) MEMORY CELL WITH IMPROVED RETENTION

(75) Inventors: Lee Wee Teo, Singapore (SG); Chunshan Yin, Singapore (SG); Shyue Seng Tan, Singapore (SG); Chung Foong Tan, Singapore (SG); Jae Gon Lee, Singapore (SG); Elgin Quek, Singapore (SG); Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 271 days.

(21) Appl. No.: 12/650,561

(22) Filed: Dec. 31, 2009

(65) Prior Publication Data

US 2011/0156121 A1    Jun. 30, 2011

(51) Int. Cl.
*H01L 21/336*    (2006.01)
*H01L 29/788*    (2006.01)

(52) U.S. Cl.
USPC .............. 438/267; 257/315; 257/E21.209; 257/E29.3

(58) Field of Classification Search
USPC ............ 257/321, E21.18, E21.21, E21.679, 257/314, 324, 325, E21.214, E21.177, E29.132, 257/E21.423, E29.309; 438/288, 972, 695, 438/594, 287, 758, 591; 977/773
See application file for complete search history.

(56) References Cited

U.S. PATENT DOCUMENTS

| 5,824,584 | A  | * | 10/1998 | Chen et al. .................... 438/267 |
|---|---|---|---|---|
| 6,222,778 | B1 | * | 4/2001 | Ahn et al. ................. 365/189.07 |
| 7,045,854 | B2 | * | 5/2006 | Osabe et al. .................. 257/317 |
| 7,416,945 | B1 | * | 8/2008 | Muralidhar et al. .......... 438/267 |
| 2007/0221983 | A1 | * | 9/2007 | Lojek ............................ 257/315 |
| 2008/0188052 | A1 | * | 8/2008 | Winstead et al. ............. 438/299 |
| 2008/0242022 | A1 | * | 10/2008 | Rao et al. ...................... 438/257 |
| 2009/0085094 | A1 | * | 4/2009 | Lee et al. ....................... 257/321 |
| 2010/0029052 | A1 | * | 2/2010 | Kang et al. .................... 438/261 |
| 2010/0283101 | A1 | * | 11/2010 | Chen et al. .................... 257/325 |

OTHER PUBLICATIONS

D Nesheva et al., Absorption and transport properties of Si rich oxide layers annealed at various temperatures, 2008, pp. 1-8, Semicon. Sci. Technol., IOP Publishing.

Zhenrui Yu and Mariano Aceves-Mijares, Study of the conduction properties of silicon-rich oxide under illumination, Thin Solid Films vol. 473, Issue 1, Feb. 1, 2005, pp. 145-150.

T. Noma, K.S. Seol, M. Fujimaki, H. Kato, T. Watanabe and Y. Ohki, Photoluminescence Analysis of Plasma-deposited Oxygen-rich Silicon Oxynitride Films, Jpn. J. Appl. Phys. vol. 39 (2000), Part 1. No. 12A. Dec. 2000, pp. 6587-6593.

M. Oishi et al., Fabrication of silicon nano-crystal on SiO2 by ultrahigh-vacuum chemical deposition, vol. 638, 2001, Materials Research Society, Mater. Res. Soc, Warrendale, PA, USA.

* cited by examiner

*Primary Examiner* — Matthew Landau
*Assistant Examiner* — Latanya N Crawford
(74) *Attorney, Agent, or Firm* — Horizon IP Pte. Ltd.

(57) ABSTRACT

A method for forming a device is presented. A substrate prepared with a feature having first and second adjacent surfaces is provided. A device layer is formed on the first and second adjacent surfaces of the feature. A first portion of the device layer over the first adjacent surface includes nano-crystals, whereas a second portion of the device layer over the second adjacent surface is devoid of nano-crystals.

21 Claims, 16 Drawing Sheets

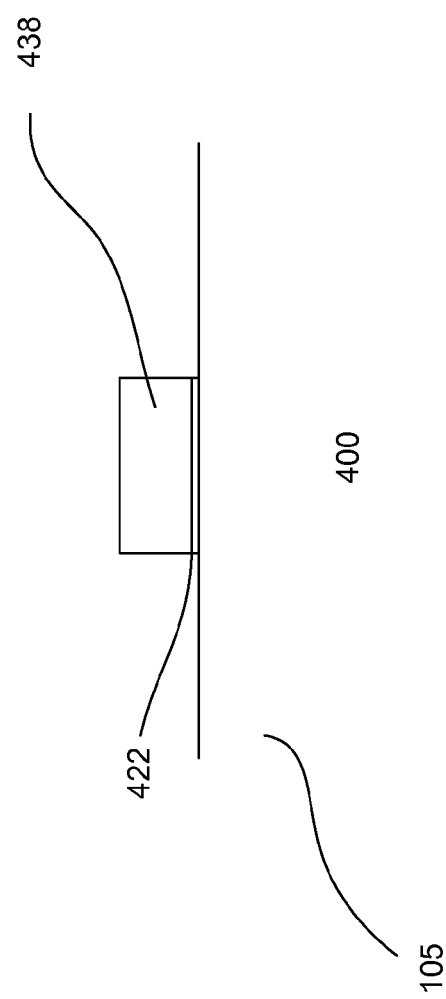

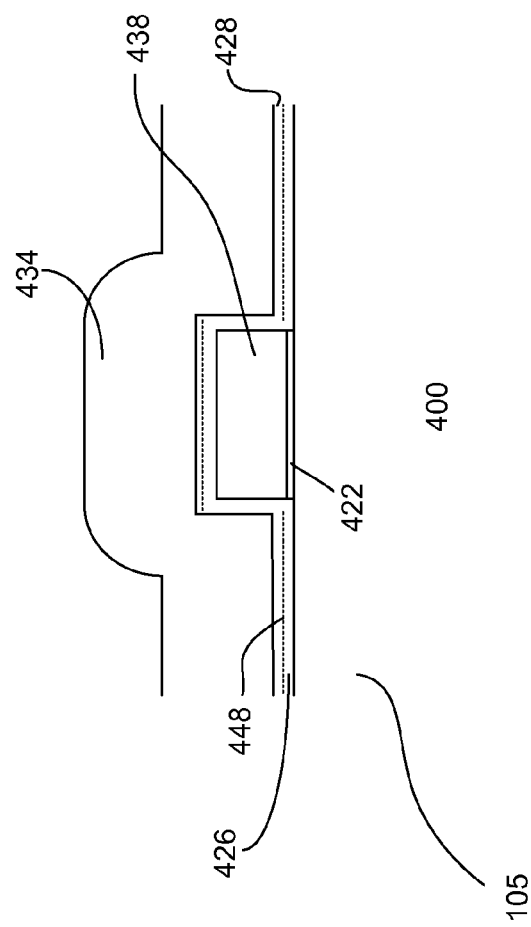

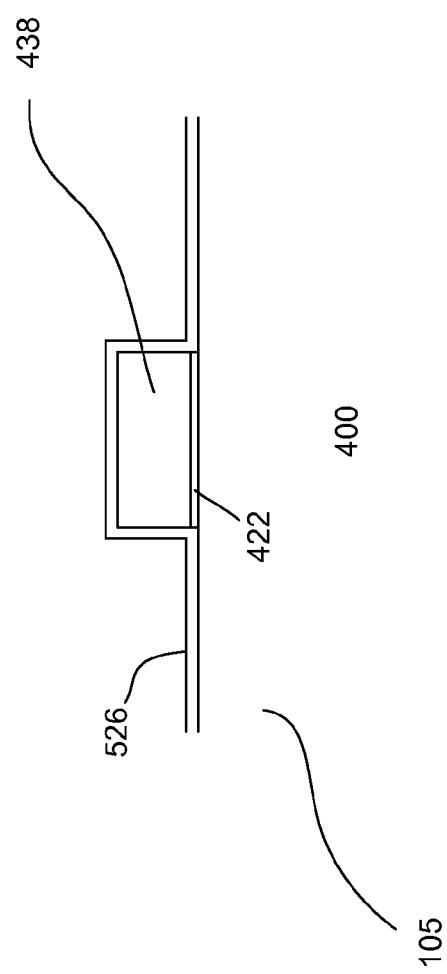

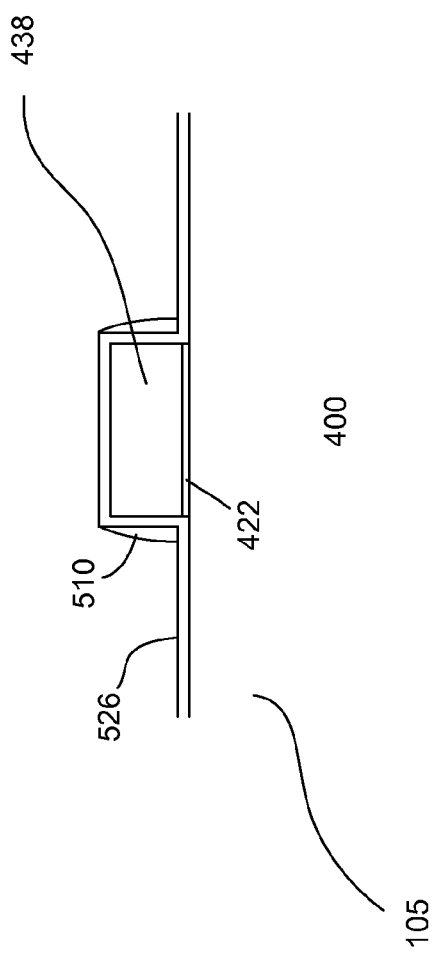

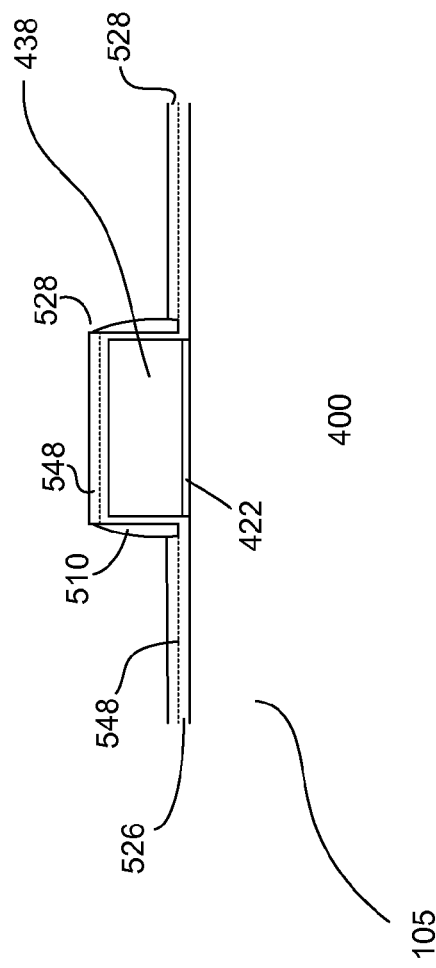

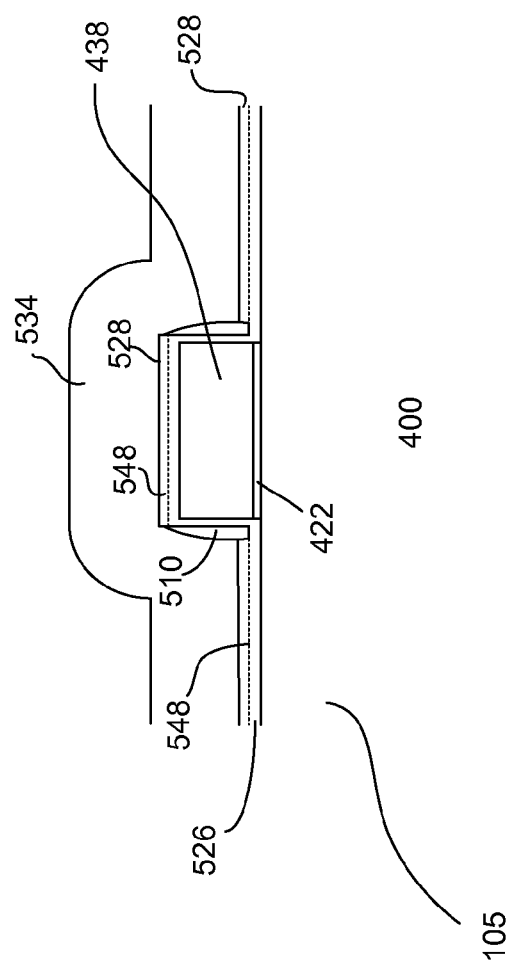

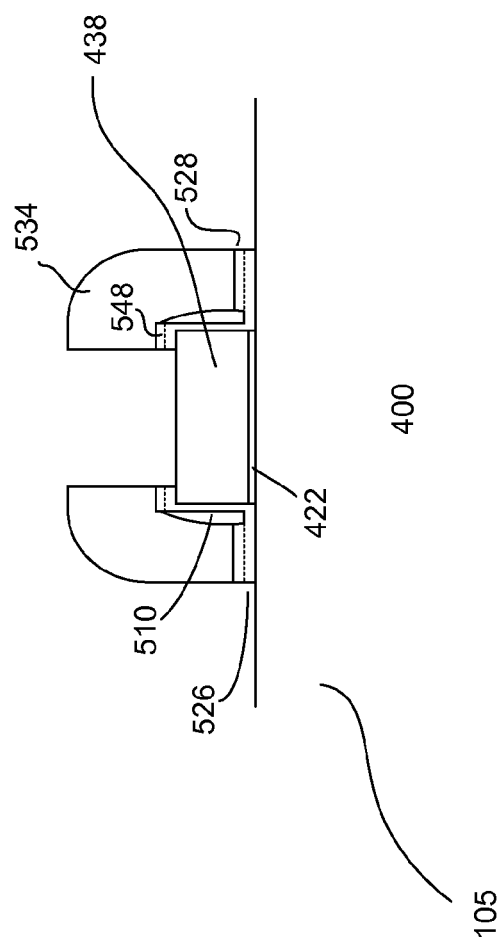

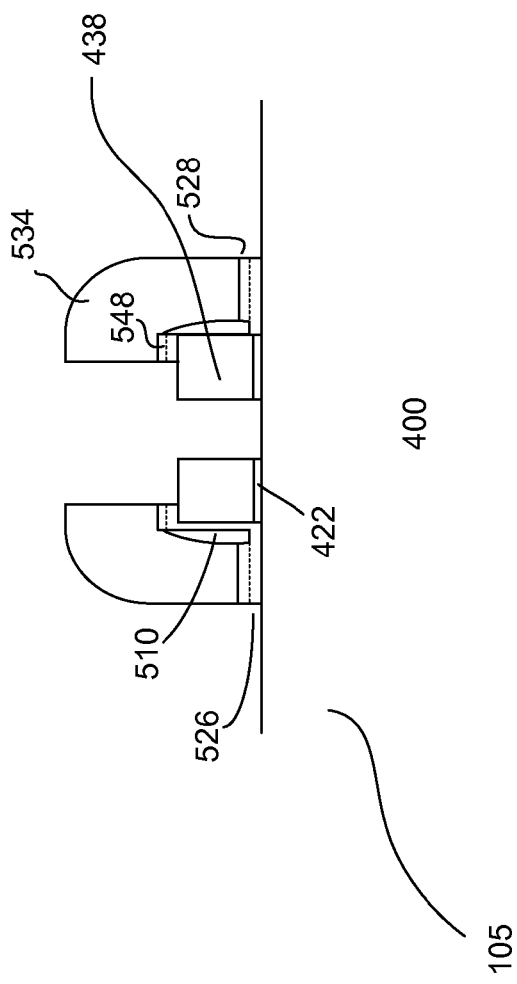

MEMORY CELL WITH IMPROVED RETENTION

BACKGROUND

Non-volatile memory (NVM) circuits have achieved widespread adoptions for code and data storage applications. An important aspect of NVM circuits is their performance, which includes endurance (number of programming or write/erase cycles) and data retention after write/erase cycling. Within the industry, the performance of NVM technology has been characterized extensively. Generally, the NVM circuits should be able to endure over 100 thousand to 1 million programming cycles with data retention exceeding 20 years, even at extreme ambient temperatures.

Programming the memory to a program state involves, for example, injecting hot electrons into the gate dielectric of the floating or select gate of the memory cell, while erasing involves discharging the gate dielectric by (Fowler-Nordheim) FN tunneling. Leakage paths in the dielectric layer can exist, degrading the retention of the memory cell.

SUMMARY

A method for forming a device is presented. A substrate prepared with a feature having first and second adjacent surfaces is provided. A device layer is formed on the first and second adjacent surfaces of the feature. A first portion of the device layer over the first adjacent surface includes nano-crystals, whereas a second portion of the device layer over the second adjacent surface is devoid of nano-crystals.

In another embodiment, an alternative method for forming a device is disclosed. A substrate prepared with a second gate feature is provided. The second gate feature has side and top surfaces. A first gate dielectric layer is formed over the second gate feature and substrate. The first gate dielectric layer is processed to form nano-crystals in first and third portions of the first gate dielectric layer over the top surface of the second gate feature and substrate, while a second portion on the side surfaces of the second gate feature are devoid of nano-crystals. A first gate electrode layer is formed over the substrate. The first gate electrode layer, first gate dielectric layer and second gate feature are patterned to form a memory cell with a split gate.

In yet another embodiment, a device is presented. The device includes a feature disposed on a substrate. The feature has first and second adjacent surfaces. The device also includes a device layer on the first and second adjacent surfaces of the feature. A first portion of the device layer over the first adjacent surface includes nano-crystals, whereas a second portion over the second adjacent surface is devoid of nano-crystals.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which:

FIGS. 4a-g show an embodiment of a process for forming a memory cell;
and
FIGS. 5a-f show another embodiment of a process for forming a memory cell.

DETAILED DESCRIPTION

Embodiments generally relate to semiconductor devices. More particularly, some embodiments relate to memory devices, such as non-volatile memory devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1:
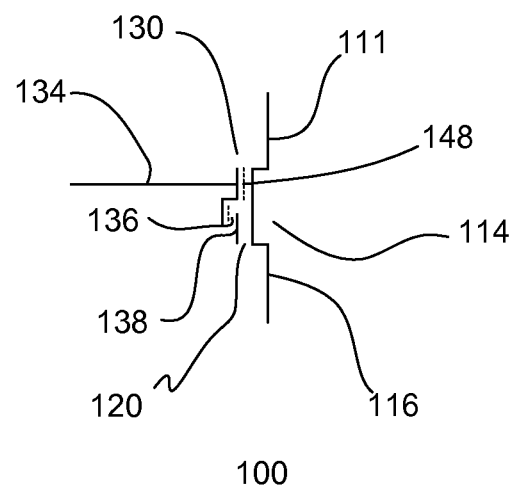
FIG. 1 shows an embodiment of a memory cell.

FIG. 1 shows a schematic diagram of an embodiment of a memory cell 100. The memory cell, in one embodiment, comprises a non-volatile memory cell. The memory cell comprises a transistor with a gate 130 over a channel 114 and between first and second terminals 111 and 116. The gate comprises a split gate having a first gate 134 and a second gate 138. In one embodiment, the first gate comprises a control gate, the first terminal comprises a source terminal, the second gate comprises a select gate and the second terminal comprises a drain terminal. Other configurations of gates and terminals are also useful. For example, the first gate can be a select gate, the first terminal can be a drain terminal, the second gate can be a control gate and the second terminal can be a source terminal.

In one embodiment, the first gate is adjacent to and partially overlaps the second gate. For example, the control gate is adjacent to and partially overlaps the select gate. In one embodiment, a portion of the control gate is disposed over the channel region and partially overlaps the select gate in an overlap region 136. A gate dielectric layer or layers 120 isolate the gates from each other and the channel. Other configurations of the gates, for example, non-overlapping gates may also be useful.

The control gate is coupled to a control gate voltage source ($V_{cg}$), the select gate is coupled to a select gate voltage source ($V_{sg}$), the source terminal is coupled to a source voltage source ($V_s$), and the drain is coupled to a drain voltage source ($V_d$). For example, $V_{cg}$ can be about 0-14 V or about 8-9.5V, $V_{sg}$ can be about 0-3V or about 1-1.5V, $V_d$ can be about 0-7.5V or about 0-3V and $V_s$ can be about 0-5V or about 0-0.5V. To program, for example, $V_s$ can be about 5V, $V_{cg}$ can be about 9V, $V_{sg}$ can be about 1.2V, $V_d$ can be about 0V. To erase, for example, $V_{cg}$ can be about 14V, $V_{sg}$ can be equal to $V_s$ and $V_d$, which is about 0V. To read, for example, $V_s$ can be about 0V, $V_{cg}$ can be about 1.2V, $V_{sg}$ can be about 1.2V and $V_d$ can be about 0.5V. Other voltage values can be supplied to the memory cell, for example, depending on the technology. The appropriate voltages are supplied to the memory cell to access the memory cell, such as programming and reading.

In one embodiment, the gate dielectric layer comprises first and second gate dielectric layers. The second gate dielectric layer isolates the second gate from the substrate; the first gate dielectric layer isolates the first gate from the second gate as well as the first gate from the substrate.

In one embodiment, the first gate dielectric layer comprises nano-crystals 148. Nano-crystals improve charge storage of the memory cell. In one embodiment, the nano-crystals comprise silicon nano-crystals. Other types of nano-crystals may also be useful. For example, germanium or other types of nano-crystals may be used. The first gate dielectric layer comprises first and second portions. For example, the first portions are along a first direction which is parallel (e.g., horizontal) to the major surface of the substrate on which the memory cell is formed while the second portions are perpendicular (e.g., vertical). In accordance with one embodiment, the first portions of the first gate dielectric layer comprise nano-crystals while the nano-crystals are absent from the second portions. It has been discovered that, by avoiding nano-crystal formation at the vertical or sidewall of the control gate and select gate, leakage path can be eliminated, thereby improving retention characteristics of the memory cell.

Figure 2:
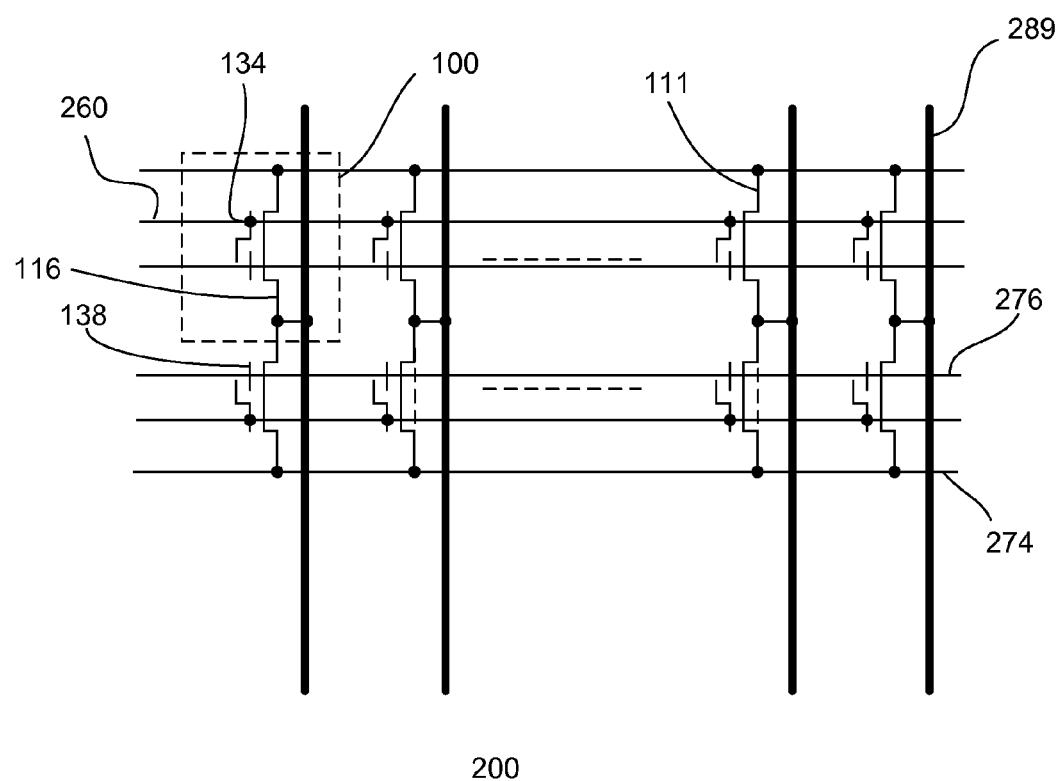
FIG. 2 shows an embodiment of a memory array.

FIG. 2 shows an embodiment of a memory array 200. In one embodiment, the memory array comprises a non-volatile memory array. The memory array comprises a plurality of memory cells arranged in rows and columns. The memory cells, for example, comprise memory cells 100 as described in FIG. 1. A row corresponds to, for example, a wordline (WL) 276 and a column corresponds to a bitline (BL) 289 of the array. In one embodiment, the BLs are coupled to the second or drain terminals 116 while WLs 276 are coupled to the second or select gates 138 of the memory cells. For example, WLs provide $V_{sg}$, BLs provide $V_d$. Source lines (SLs) 274 may be employed to provide $V_s$ to the first or source terminals 111; control gate lines or CGLs 260 may be used to provide $V_{cg}$ to the control gates 134 of the memory cells. SLs and CGLs maybe coupled to the memory cells as desired. The memory cells may be configured in a NOR type array architecture. Arranging the memory cells in other types of array architectures, such as NAND, is also useful.

Figure 3:
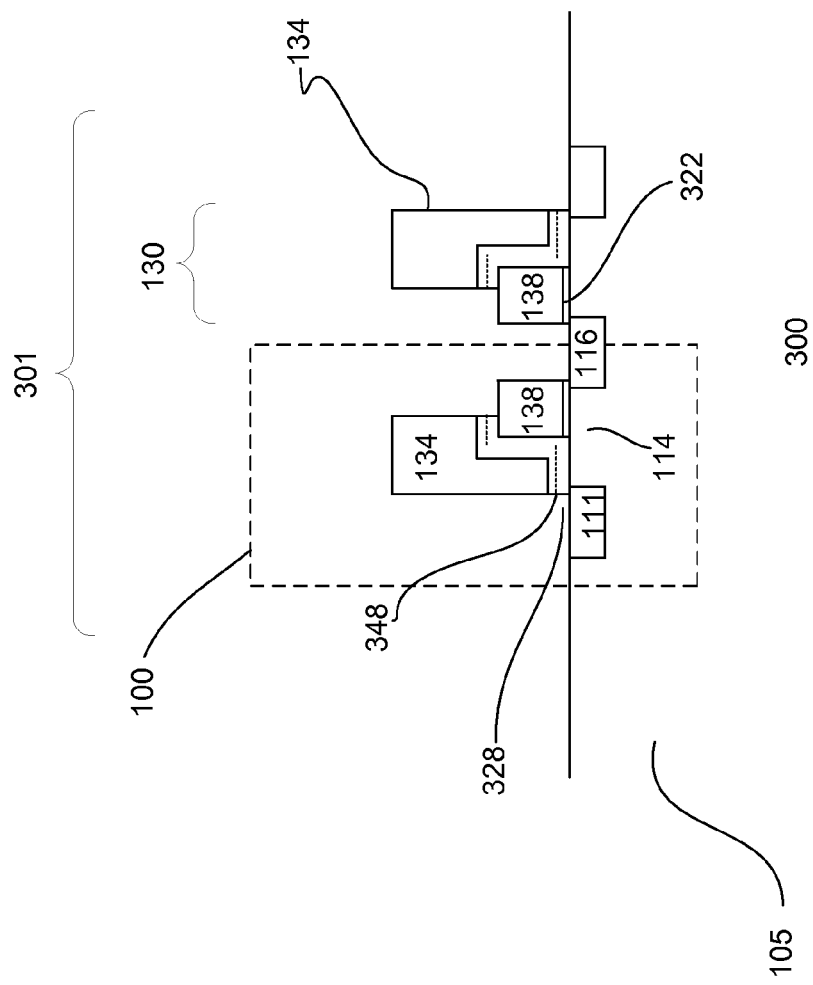
FIG. 3 shows a cross-sectional view of an embodiment of a memory cell.

FIG. 3 shows a portion 300 of an embodiment of a device or IC. As shown, the portion includes a substrate 105. The substrate, for example, comprises a silicon substrate. The substrate can be lightly doped with p-type dopants. Other types of substrates, such as silicon germanium or silicon-on-insulator (SOI), are also useful.

The substrate can be prepared with a region 301 containing memory cells 100. In one embodiment, the memory cells comprise non-volatile memory cells. Other types of memory cells are also useful. The region can be referred to as an array region. Providing a substrate prepared with other types of regions may also be useful. The array region shows adjacent memory cells. Although only two memory cells are shown, it is understood that many more memory cells are included in the device. The array region can be arranged to have sub-regions corresponding to, for example, groups of memory cells.

The array region comprises doped wells (not shown) with dopants of a first polarity type. The doped wells may be intermediately or heavily doped. The first polarity type can be n-type or p-type, depending on the memory cell type. The first polarity type wells are used for second polarity type memory cells. For example, n-type wells are used for p-type memory cells while p-type wells are used for n-type memory cells. Providing an array region with a combination of first and second type memory cell regions may also be useful. P-type dopants can include boron (B), aluminum (Al), indium (In) or a combination thereof while n-type dopants can include phosphorus (P), arsenic (As), antimony (Sb) or a combination thereof.

Additionally, the substrate may include a logic portion (not shown) for support circuitry. The substrate may also include regions for other types of circuitry, depending on the type of device or IC.

The substrate includes isolation regions (not shown) to isolate active device regions from other active device regions, as required. The isolation regions, for example, comprise shallow trench isolation (STI) regions. Other types of isolation regions are also useful.

In one embodiment, a memory cell comprises a transistor with a gate 130 between first and second terminals 111 and 116. The first terminal, for example, serves as a source and the second terminal serves as a drain. The source and drain comprise, for example, second polarity type dopants.

The gate, in one embodiment, comprises a split gate with first and second gates 134 and 138. For example, the first gate comprises a control gate and the second gate comprises a select gate. The gates, for example, comprise polysilicon. Other gate materials are also useful. The gates are isolated from each other and the substrate by a gate dielectric layer. In one embodiment, the gate dielectric layer comprises a first gate dielectric layer 328 separating the first (e.g., control) gate from the second gate and a substrate or channel 114 and a second (e.g., select) gate dielectric layer 322 separating the second gate from the channel. The first gate dielectric layer comprises a tunneling dielectric layer. The tunneling dielectric layer, for example, comprises silicon oxide of about 6-20 nm thick. In one embodiment, the second gate dielectric layer comprises a low voltage (LV) gate dielectric layer. The LV gate dielectric layer, for example, can comprise silicon oxide having a thickness of about 10-100 Å. Other materials or thicknesses may also be useful for the gate dielectric layers.

The gate, for example, may be a gate conductor which serves as a common gate for a row of memory cells. Adjacent memory cells can be configured as mirror gate electrodes which may share a common diffusion region. Other configurations or layouts of memory cells are also useful.

The first or control gate dielectric layer comprises first and second portions in first and second directions due to the contour of the gates. The first direction, for example, is parallel or horizontal to the major surface of the substrate while the second direction is perpendicular or vertical. Nano-crystals are provided in the first gate dielectric to improve charge retention. In one embodiment, the nano-crystals comprise silicon. Other types of nano-crystals may also be used. For example, nano-crystals may comprise germanium or other types of crystalline material. In one embodiment, nano-crystals are only present in at least some of the first portions of the first gate dielectric layer while absent from the second portions. In one embodiment, the nano-crystals are only present in at least some of the horizontal portions of the first gate dielectric layer while absent from the vertical portions.

Figure 4B:
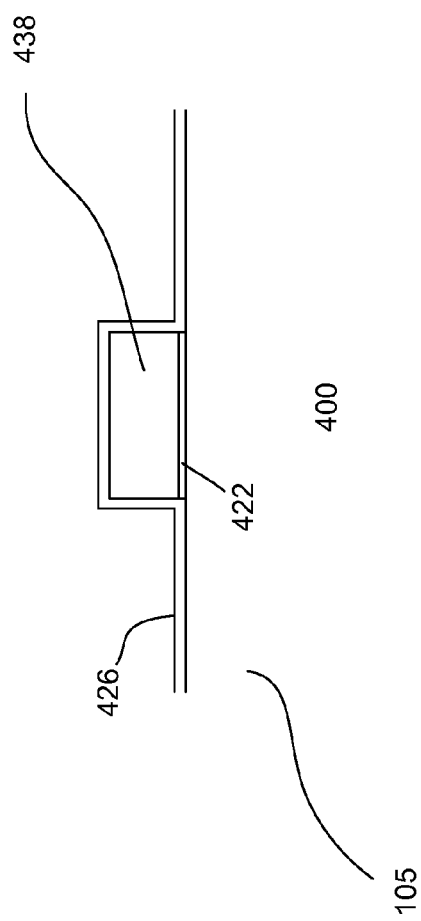

FIGS. 4a-g show cross-sectional views of an embodiment of a process for forming a device or IC. Referring to FIG. 4a, a substrate 105 is provided. The substrate can comprise a silicon substrate, such as a lightly p-type doped substrate. Other types of substrates, including silicon germanium or silicon-on-insulator (SOI), are also useful.

The substrate is prepared with an array region containing memory cells. In one embodiment, the memory cells comprise non-volatile memory cells. Other types of memory cells are also useful. The array region comprises doped wells (not shown) with dopants of a first polarity type. The doped wells may be intermediately or heavily doped wells. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al), indium (In) or a combination thereof while n-type dopants can include phosphorus (P), arsenic (As), antimony (Sb) or a combination thereof.

Additionally, the substrate may include a logic portion (not shown) for support circuitry. The substrate may also include regions for other types of circuitry, depending on the type of device or IC.

Generally, the IC includes regions with both first and second type wells. To form the doped wells, ion implantation techniques, such as implantation with a mask, can be used. The first and second type wells can be formed in separate processes. Other techniques for forming the active regions are also useful.

The substrate can be prepared with isolation regions (not shown), for example, to separate the active regions from each other and other active device regions. In one embodiment, the isolation regions comprise STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

The substrate may be implanted with dopants to define the initial gate threshold voltage (VT). Various layers of the second or select gate are formed on the substrate. In one embodiment, a second or select gate dielectric layer 422 is formed on the substrate. The second gate dielectric layer, for example, comprises a LV gate dielectric layer. The second gate dielectric layer, in one embodiment, comprises silicon oxide. Other types of gate dielectric layers, such as silicon oxynitride, may also be used. Various techniques, such as thermal oxidation or CVD, can be employed to form the second gate dielectric layer. The thickness of the second gate dielectric layer may be about 10-100 Å. The second gate dielectric layer can be formed using other types of dielectric materials or thicknesses.

A second gate electrode layer 438 is deposited on the second gate dielectric layer. The second gate electrode layer comprises, in one embodiment, polysilicon. The gate electrode layer can be formed as an amorphous or non-amorphous layer. The gate electrode may be doped. Various techniques may be employed to dope the gate electrode, for example, insitu doping or ion implantation. Providing an undoped gate electrode layer may also be useful. Other types of gate electrode materials are also useful. The thickness of the second gate electrode layer may be about 50-500 Å. In other embodiments, the thickness of the second gate electrode layer may be about 500-2000 Å. Other thicknesses are also useful. To form the second gate electrode layer, techniques such as chemical vapor deposition (CVD), can be used. Other techniques are also useful.

The various second gate layers are patterned. In one embodiment, the various layers are patterned to form a dual second or select gate stack. Techniques, such as mask and etch, can be used to form the dual select gate stack. For example, a photoresist layer is formed over the gate layers and patterned, exposing portions of the gate layers. An anisotropic etch, such as a reactive ion etch (RIE), is performed to remove exposed portions of the gate layers. To improve lithographic resolution, an anti-reflective coating (ARC) can be provided beneath the photoresist.

Referring to FIG. 4b, a first gate dielectric layer is formed on the substrate, covering the dual select gate stack. The first gate dielectric layer serves as a tunneling oxide. In one embodiment, the first gate dielectric comprises first and second sub-layers. The first sub-layer 426, for example, comprises silicon oxide. Other types of dielectric materials are also useful. The first sub-layer 426 maybe formed by, for example, thermal oxidation. In one embodiment, the first sub-layer is formed by furnace deposition. The wet or dry oxidation temperature can be about 800° C. Other techniques for forming the sub-layer can also be useful. The thickness of the first sub-layer 426 can be in a range of about 10-100 Å. Other thicknesses may also be useful.

Figure 4C:
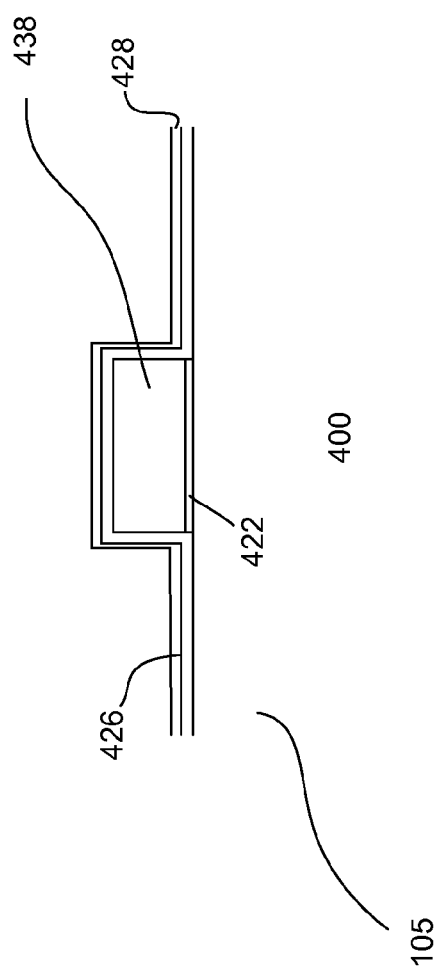

As shown in FIG. 4c, the second sub-layer 428 is formed over the first sub-layer 426. The sub-layers are subsequently processed to provide nano-crystals in the first or control gate dielectric layer. In one embodiment, the second sub-layer comprises silicon to provide silicon nano-crystals in the control gate dielectric layer. The second sub-layer, for example, comprises amorphous silicon. Other types of silicon comprising layers may also be useful. Providing other types of second sub-layers for different types of nano-crystals, for example, germanium, is also useful.

The second sub-layer is selectively deposited or formed on the substrate. The second sub-layer, as will be described in detail, is subsequently processed to form nano-crystals. In one embodiment, the second sub-layer comprises a non-conformal layer which forms on the horizontal portions (e.g., along or substantially along the plane of the substrate) of the substrate more selectively than the non-horizontal portions. For example, the second sub-layer is selectively formed on the first or horizontal portions of the substrate. In one embodiment, selectively forming the second sub-layer deposits the second sub-layer on the first portions at a greater rate than the second portions. For example, more of the sub-layer is formed on the top surface of the second gate and substrate than the sides of the second gate.

In one embodiment, the selective deposition forms a second sub-layer of sufficient thickness on horizontal portions to form nano-crystals when subsequently processed while the non-horizontal or vertical portions have a thickness less than that which forms nano-crystals when processed. This avoids the formation of nano-crystals on the sides of the gate. For example, the second sub-layer is selectively deposited by a physical vapor deposition (PVD) process. PVD processes can include, for example, sputtering. PVD processes can deposit the layer with greater than or equal to 6:1 horizontal to vertical deposition rate ratio. Other selective deposition processes may also be useful.

Figure 4D:
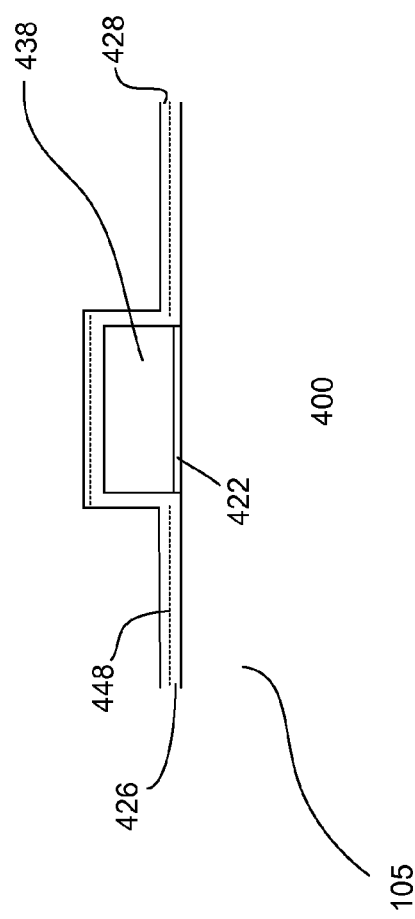

As shown in FIG. 4d, nano-crystals 448 are formed in the first gate dielectric layer. To form nano-crystals, the substrate is processed to consume some of the horizontal portions of the second sub-layer 428 to form nano-crystals therein while fully consuming the non-horizontal portions. Fully consuming the non-horizontal portions prevents formation of nano-crystals therein. In one embodiment, an oxidation process, such as an anneal, is employed to oxidize the second sub-layer 428. The oxidation forms nano-crystals in some of the horizontal portions of the second sub-layer 428 while fully consuming the non-horizontal portions.

In one embodiment, a dielectric cap layer can be formed over the nano-crystals. The cap layer can be formed by, for example, CVD or rapid thermal CVD (RTCVD). The dielectric cap layer improves tunneling voltage.

A first gate electrode layer 434 is deposited on the substrate, as shown in FIG. 4e. The first gate electrode layer, in one embodiment, comprises polysilicon. The gate electrode layer can be formed as an amorphous or non-amorphous layer. The gate electrode layer can be doped or undoped. Other types of gate electrode materials are also useful. The thickness of the control gate electrode layer is, for example, about 100-500 Å. Other thicknesses are also useful. To form the first gate electrode layer, techniques, such as chemical vapor deposition (CVD), can be used. Other techniques are also useful.

Figure 4F:
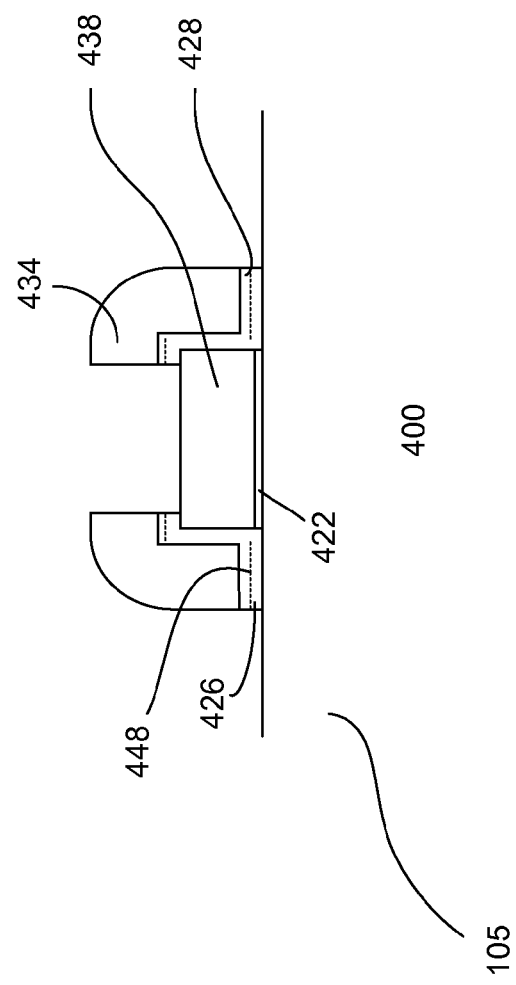
Figure 4G:
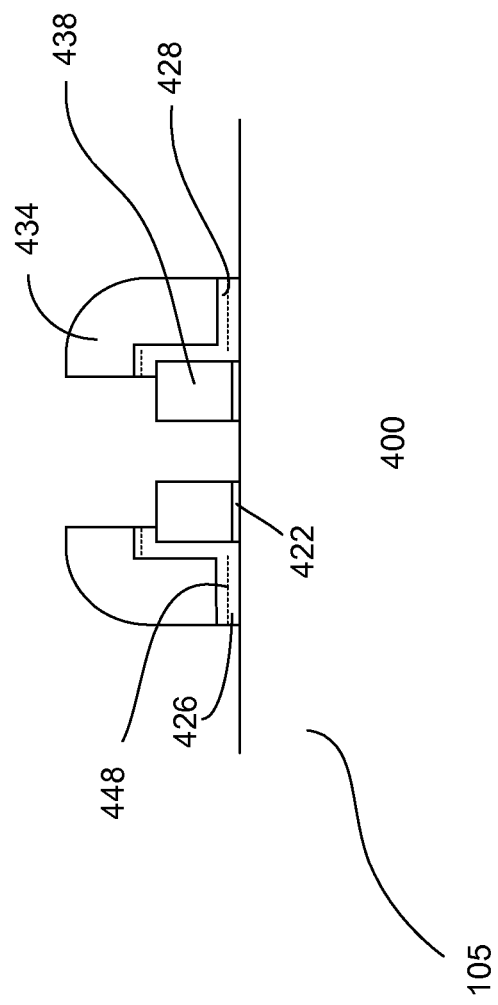

Referring to FIGS. 4f-g, the substrate is patterned to form adjacent memory cells from the dual gate stack. Techniques, such as mask and etch, can be used to pattern the substrate. For example, a hard mask can be used. The hard mask may be patterned by a photoresist mask. Using the patterned hard mask, an anisotropic etch, such as RIE, patterns the gate layers to create the desired structure. In one embodiment, patterning of the substrate to form adjacent cells can employ dual damascene techniques. For example, first patterning process patterns the first gate and first gate dielectric layer, as shown in FIG. 4f. A second patterning process patterns the dual second gate stack, as shown in FIG. 4g.

The process continues to form the device. For example, additional processing can include removing of the mask layer, forming gate sidewall spacers, source/drain diffusion regions and salicide contacts, filling gaps with dielectric material, forming one or more interconnect levels, final passivation, dicing, assembly and packaging. Other processes are also useful. For example, other components, such as LV, HV and I/O devices can be formed prior to forming the interconnections. The memory cells can be formed as a memory device or embedded into a part of ICs.

FIGS. 5a-f show an alternative embodiment of the process. Referring to FIG. 5a, a substrate 105 is processed to form a second dual gate stack on the substrate as shown in FIG. 4a. The second dual gate stack comprises a second gate dielectric layer 422 and a second gate electrode 438. The process continues by forming a first gate or inter-gate dielectric layer on the substrate. In one embodiment, the first gate dielectric layer comprises a dielectric stack with multiple sub-layers.

As shown, a first sub-layer 526 is formed on the substrate, covering it and the dual gate stack. The first sub-layer serves as a tunneling oxide. The first sub-layer, in one embodiment, comprises a silicon-rich dielectric layer. The silicon-rich dielectric layer comprises, in one embodiment, $Si_x$, where x=1-1.5. Various techniques, such as thermal vacuum evaporation of SiO or low pressure chemical vapor deposition (LPCVD), can be used to deposit the Si-rich dielectric film over the substrate. In one embodiment, the Si-rich dielectric film is deposited using LPCVD. The LPCVD is at a pressure of about 0.1 to 100 torr and a temperature of about 200 to 600° C. Other techniques for forming the first sub-layer are also useful. The thickness of the Si-rich dielectric film can be in a range of, for example, about 6 to 20 nm.

In FIG. 5b, dielectric sidewall spacers 510 are provided on sidewalls of the second dual gate stack. The sidewall spacers should be sufficient to prevent formation of nano-crystals on non-horizontal portions of the first sub-layer of the first gate dielectric layer. In one embodiment, the dielectric sidewall spacers comprise oxygen-rich dielectric material. In one embodiment, the dielectric sidewall spacers comprise oxygen-rich oxide. For example, the sidewall spacers comprise oxygen-rich SiON. Other types of oxygen-rich dielectric material can also be used to form the spacers. The thickness of the spacers, for example, is about 100 to 500 Å. Other thicknesses may also be useful.

To form sidewall spacers, a spacer dielectric layer is deposited on the substrate. The spacers can be formed by using various techniques, such as plasma enhanced chemical vapor deposition (PECVD). Other techniques to form the spacer dielectric layer are also useful. The spacer dielectric layer is subsequently anisotropically etched, such as by reactive ion etching (RIE), to remove horizontal portions, leaving non-horizontal portions on sidewalls as spacers.

As shown in FIG. 5c, the portions of the first sub-layer exposed or unprotected by the spacers are processed. In one embodiment, the exposed portions of the first sub-layer are processed to form nano-crystals 548 therein. In one embodiment, the exposed portions of the first sub-layer are processed to selectively form silicon nano-crystals therein. Forming other types of nano-crystals in the first sub-layer may also be useful. By protecting the non-horizontal portions of the first sub-layer with the spacers, the nano-crystals are selectively formed only in the exposed portions of the first sub-layer.

In one embodiment, processing to form nano-crystals comprises annealing the substrate. The annealing is performed at about 600 to 1000° C. for about a few milliseconds to a few hundred seconds. Other annealing temperature or durations may also be useful. The processing forms nano-crystals as well as an oxide layer on the exposed portions of the first sub-layer.

The process continues as illustrated in FIGS. 4e-g, for example, as shown in FIGS. 5d-f. In FIG. 5d, a first gate electrode layer 534 is deposited on the substrate. The first gate electrode layer, in one embodiment, comprises polysilicon. The gate electrode layer can be formed as an amorphous or non-amorphous layer. The gate electrode layer can be doped or undoped. Other types of gate electrode materials are also useful. The thickness of the control gate electrode layer is, for example, about 100-500 Å. Other thicknesses are also useful. To form the first gate electrode layer, techniques, such as chemical vapor deposition (CVD), can be used. Other techniques are also useful.

Referring to FIGS. 5e-f, the substrate is patterned to form adjacent memory cells from the dual gate stack. Techniques, such as mask and etch, can be used to pattern the substrate. For example, a hard mask can be used. The hard mask may be patterned by a photoresist mask. Using the patterned hard mask, an anisotropic etch, such as RIE, patterns the gate layers to create the desired structure. In one embodiment, patterning of the substrate to form adjacent cells can employ dual damascene techniques. For example, first patterning process patterns the first gate and first gate dielectric layer, as shown in FIG. 5e. A second patterning process patterns the dual second gate stack, as shown in FIG. 5f.

Additional processing can be included to form a device, such as forming salicide contacts, filling gaps with dielectric material, forming one or more interconnect levels, final passivation, dicing, assembly and packaging. Other processes are also useful. The memory cells can be formed as a memory device or embedded into a part of ICs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor device comprising:
providing a substrate prepared with a second gate feature having side and top surfaces;
forming a first gate dielectric layer having first and second sub-layers over the second gate feature and substrate;
processing the first gate dielectric layer to form nano-crystals in first and third portions of the first gate dielectric layer over the top surface of the second gate feature and substrate while a second portion on the side surfaces of the second gate feature are devoid of nano-crystals, wherein the first and third portions of the second sub-layer of the first gate dielectric layer are formed with a sufficient thickness to form nano-crystals when subsequently processed, and the second portion of the second sub-layer of the first gate dielectric layer is formed with a thickness insufficient to form nano-crystals when subsequently processed;
forming a first gate electrode layer over the substrate; and
patterning the first gate electrode layer, first gate dielectric layer and second gate feature to form a memory cell with a split gate.

2. The method of claim 1 wherein the memory cell comprises a non-volatile memory cell.

3. The method of claim 1 wherein the first gate dielectric layer comprises silicon or germanium nano-crystals.

4. The method of claim 1 wherein the first sub-layer of the first gate dielectric layer comprises silicon oxide.

5. The method of claim 1 wherein the second sub-layer of the first gate dielectric layer is processed to form nano-crystals in the first and third portions while its second portion is fully consumed.

6. The method of claim 1 wherein the formation of the first gate dielectric layer comprises a PVD process.

7. The method of claim 5 wherein the formation of the nano-crystals comprises oxidation.

8. The method of claim 5 wherein the full consumption of the second portion of the first gate dielectric layer comprises oxidation, wet etch, or a combination thereof.

9. A method for forming a device comprising:
providing a substrate prepared with a feature having top and side surfaces; and
forming a continuous device layer on the top and side surfaces of the feature and a top surface of the substrate;
processing the continuous device layer to form nano-crystals along first and third portions of the device layer over the top surface of the feature and the substrate and a second portion over the side surface of the feature is devoid of nano-crystals, wherein
the first and third portions of the device layer are formed with a sufficient thickness to form nano-crystals when subsequently processed; and
the second portion of the device layer is formed with a thickness insufficient to form nano-crystals when subsequently processed.

10. The method of claim 9 wherein the device comprises a memory cell with a split gate.

11. The method of claim 9 wherein the device layer comprises silicon or germanium nano-crystals.

12. The method of claim 9 wherein the second portion of the device layer is fully consumed.

13. The method of claim 9 wherein the device layer comprises first and second sub-layers.

14. The method of claim 10 wherein the device layer comprises a gate dielectric layer.

15. The method of claim 13 wherein the formation of the nano-crystals comprises oxidation.

16. The method of claim 15 wherein the second portion of the device layer is fully consumed.

17. A method of forming a device comprising:
providing a substrate prepared with a feature having top and side surfaces; and
forming a continuous device layer covering the top and side surfaces of the feature and a top surface of the substrate;
forming a spacer on a second portion of the device layer over the side surface of the feature; and
processing the continuous device layer to form nano-crystals in first and third portions of the device layer over the top surfaces of the feature and the substrate, wherein the spacer prevents formation of nano-crystals in the second portion of the device layer over the side surface of the feature during processing of the continuous device layer.

18. A device comprising:
a feature disposed on a substrate having top and side surfaces; and
a continuous device layer on the top and side surfaces of the feature and a top surface of the substrate, wherein horizontal portions of the device layer disposed over the top surface of the feature and the substrate comprise nano-crystals throughout the horizontal portions along a plane of the substrate and a non-horizontal portion over the side surface of the feature is devoid of nano-crystals, wherein the continuous device layer is a non-conformal layer with the horizontal portions having a thickness greater than the non-horizontal portion.

19. A method for forming a semiconductor device comprising:
providing a substrate prepared with a second gate feature having side and top surfaces;
depositing a first gate dielectric layer over the second gate feature and substrate;
processing the as-deposited first gate dielectric layer to form nano-crystals in first and third portions of the first gate dielectric layer over the top surface of the second gate feature and substrate while not forming nano-crystals in a second portion of the first gate dielectric layer on the side surfaces of the second gate feature;
forming a first gate electrode layer over the substrate; and
patterning the first gate electrode layer, first gate dielectric layer and second gate feature to form a memory cell with a split gate.

20. The method of claim 19 wherein:
the first and third portions of the first gate dielectric layer are formed with a sufficient thickness to form nano-crystals when subsequently processed; and
the second portion of the first gate dielectric layer is formed with a thickness insufficient to form nano-crystals when subsequently processed.

21. The method of claim 19 comprising:
forming a spacer on the second portion of the first gate dielectric layer over the side surface of the second gate feature, wherein the spacer prevents formation of nano-crystals in the second portion of the first gate dielectric layer during processing of the as-deposited first gate dielectric layer.

* * * * *